United States Patent
Liu et al.

(10) Patent No.: US 6,424,021 B1
(45) Date of Patent: Jul. 23, 2002

(54) PASSIVATION METHOD FOR COPPER PROCESS

(75) Inventors: Chung-Shi Liu, Hsin Chu; Chen-Hua Yu, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 40 days.

(21) Appl. No.: 09/607,285

(22) Filed: Jun. 30, 2000

Related U.S. Application Data

(62) Division of application No. 09/374,309, filed on Aug. 16, 1999, now Pat. No. 6,107,188.

(51) Int. Cl.$^7$ ............................................. H01L 23/58
(52) U.S. Cl. ...................................... 257/649; 438/724
(58) Field of Search ................................. 257/635, 649, 257/637, 639, 640; 438/622, 687, 393

(56) References Cited

U.S. PATENT DOCUMENTS

| | | | |
|---|---|---|---|
| 5,602,053 A | 2/1997 | Zheng et al. | 437/60 |
| 5,677,244 A | 10/1997 | Venkatraman | 437/198 |
| 5,693,563 A | 12/1997 | Teong | 437/190 |
| 5,739,579 A * | 4/1998 | Chiang et al. | 257/635 |
| 5,744,376 A | 4/1998 | Chan et al. | 437/190 |
| 6,165,891 A * | 12/2000 | Chooi et al. | 438/622 |
| 6,174,810 B1 * | 1/2001 | Islam et al. | 438/687 |
| 6,191,025 B1 * | 2/2001 | Liu et al. | 438/622 |
| 6,235,603 B1 * | 5/2001 | Melnick et al. | 438/393 |

* cited by examiner

*Primary Examiner*—David Nelms
*Assistant Examiner*—Bau T Le
(74) *Attorney, Agent, or Firm*—George O. Saile; Stephen B. Ackerman; Larry J. Prescott

(57) ABSTRACT

A composite dielectric layer and method of forming the composite dielectric layer for the passivation of exposed copper in a copper damascene structure are described. The composite layer consists of a passivation dielectric layer and an etch stop dielectric layer and is formed over the exposed copper prior to the deposit of an inter-metal or final passivating dielectric layer. Via holes are etched in the inter-metal or final passivating layer and the composite dielectric layer provides an etch stop function as well as passivation for the exposed copper conductor. A thin layer of passivation dielectric, such as silicon nitride, is formed directly over the exposed copper to passivate the copper. A thin layer of etch stop dielectric, such as silicon oxynitride, is then formed over the layer of passivation dielectric. The passivation dielectric is chosen for passivation properties and adhesion between the passivation dielectric and copper. The etch stop layer is chosen for etch stop properties. The composite layer is thinner than would be required if the layer of passivation dielectric also provided the etch stop function so that circuit capacitance is reduced by using the composite layer.

6 Claims, 4 Drawing Sheets

PASSIVATION METHOD FOR COPPER PROCESS

This is a division of patent application Ser. No. 09/374,309, filing date Aug. 16, 1999, now U.S. Pat. No. 6,107,188 Passivation Method For Copper Process, assigned to the same assignee as the present invention.

BACKGROUND OF THE INVENTION (1) Field of the Invention

This invention relates to the passivation of exposed copper in a copper damascene structure and more specifically to dielectric layers used as an etch stop as well as passivation for exposed copper.

(2) Background of the Invention

As the cross section area of conductors in integrated circuits continue to shrink the conductivity of the conductor material becomes increasingly important. While aluminum has long been the conductor material of choice in integrated circuits, materials having greater conductivity such as gold, silver, copper, or the like are used with increasing frequency.

These metals have not had more widespread use because they suffer from a number of disadvantages such as the formation of undesirable intermetallics and high diffusion rates. Copper has the additional disadvantage of being easily oxidized at relatively low temperatures. One particular problem of this easy oxidation of copper is that conventional photoresist processing can not be used to pattern the copper. At the end of the patterning process using photoresist the photoresist must be removed by heating it in a highly oxidizing environment which also oxidizes the copper conductors. One solution to this problem is the Damascene process for forming copper conductors.

Although the damascene process for forming copper conductors avoids the use of photoresist to pattern the copper conductors, exposed copper remains after the patterning process. Passivation layers over the exposed copper are required to avoid oxidation of the exposed copper or contamination of the exposed copper during subsequent process steps or during wafer storage.

U.S. Pat. No. 5,744,376 to Chan et al. describes a method of forming copper interconnections using a damascene structure with provisions to prevent both copper diffusion and copper oxidation.

U.S. Pat. No. 5,693,563 to Teong describes a method of forming copper interconnections using an etch stop in a double damascene structure having provision to prevent both copper diffusion and oxidation.

U.S. Pat. No. 5,677,244 to Venkatraman describes damascene structure using a copper alloy as a conductor material.

U.S. Pat. No. 5,602,053 to Zheng et al. describes a method of forming a dual damascene structure using copper conductors and a pair of alternating layers of silicon nitride and amorphous silicon sandwiched between two dual damascene conductors.

Patent application Ser. No. 09/349,847, Filed Jul. 8, 1999, entitled "METHOD OF FABRICATING A DAMASCENE STRUCTURE FOR COPPER MEDULLIZATION" and assigned to the same Assignee describes a method of forming a copper damascene structure over a filled contact hole and the use of a sacrificial dielectric layer to protect an etch stop layer during chemical mechanical polishing.

Patent application Ser. No. 09/349,849, Filed Jul. 8, 1999, entitled "ROBUST POST Cu-CMP IMD PROCESS" and assigned to the same Assignee describes methods of cleaning exposed copper between the steps of chemical mechanical polishing and intermetal dielectric deposition.

SUMMARY OF THE INVENTION

Forming damascene conductor structures using copper or other conducting materials requires the deposition of a layer of trench dielectric. A trench is then etched in the layer of trench dielectric to define the shape of the conductor. A layer of barrier metal is usually deposited over the trench dielectric, on the sidewalls of the trench, and on the bottom of the trench. A conductor metal, such as copper, is then deposited on the layer of barrier metal to more than fill the trench. The barrier metal and conductor metal are then removed down to the level of the trench dielectric, usually using a method such as chemical mechanical polishing, to define the conductor. This leaves exposed copper at the top of the conductor which is subject to contamination or oxidation and must be covered with a passivation layer.

Often the passivation layer must also function as an etch stop layer during subsequent processing, however materials which perform best as etch stop layers do not perform best as passivation layers. Silicon oxynitride, SiON, is usually preferred as a etch stop layer but is less desirable as a passivation layer because of delamination which can occur between copper and silicon oxynitride. Silicon nitride, SiN, avoids the delamination problem, and is a preferred passivation material, but is less desirable as an etch stop layer.

It is a principle objective of this invention to provide a method of forming a composite dielectric which performs well both as an etch stop and passivation layer.

It is another principle objective of this invention to provide a composite dielectric which performs well both as an etch stop and passivation layer.

These objectives are achieved by using a two material composite layer as a passivation layer. The first material, preferably silicon nitride, is chosen for its properties as a passivation layer and is deposited directly over the exposed copper. The second material, preferably silicon oxynitride, is chosen for its properties as an etch stop and is deposited directly over the first material. The composite layer can be thinner than a layer of the first material deposited thick enough to perform both as a passivation layer and an etch stop layer. A layer of inter-metal dielectric is then deposited over the composite layer and via holes can be formed in the inter-metal dielectric layer as needed.

DESCRIPTION OF THE PREFERRED EMBODIMENTS

Figure 1:
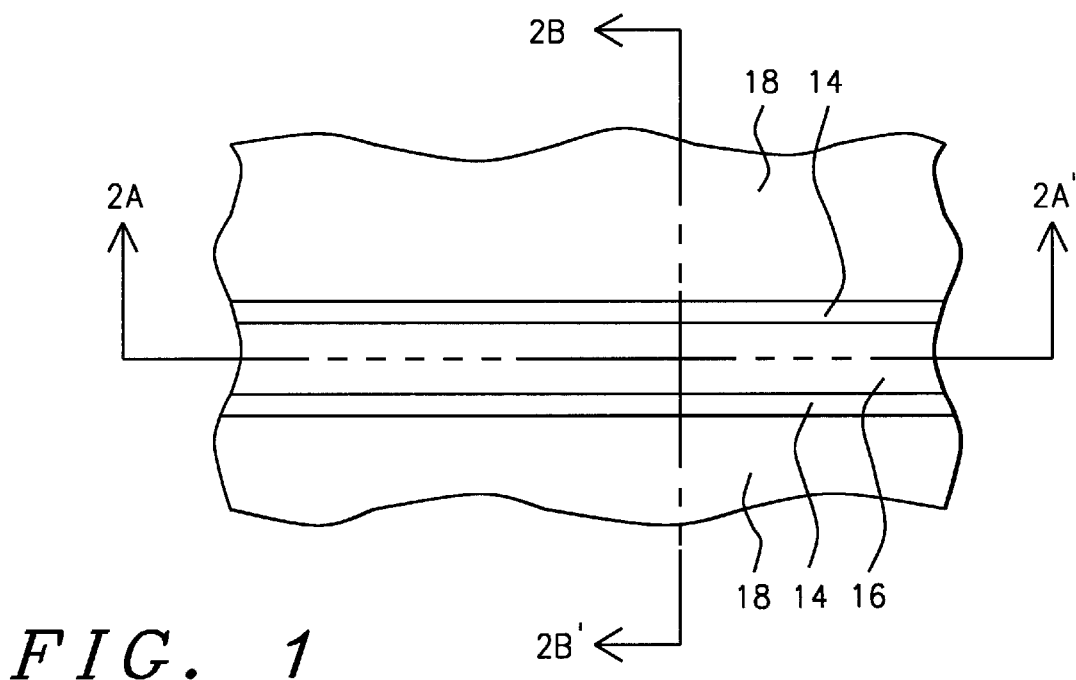
FIG. 1 shows a top view of a part of an integrated circuit wafer having a copper damascene conductor formed in a layer of trench dielectric.

The damascene structure and method of forming the damascene structure of this invention will now be described with reference to FIGS. 1–6. FIG. 1 shows a top view of a part of an integrated circuit wafer having a copper conductor 16 formed in a damascene structure. The copper conductor 16 is shown formed in a layer of second dielectric 18, such as silicon oxide or the like. A layer of barrier metal 14, such as titanium, titanium nitride, or the like, is often deposited on the sidewalls and bottom of the trench and the copper conductor 16 is formed on the barrier metal 14. The copper conductor 16 and barrier metal 14 are removed down to the level of the top of the layer of second dielectric 18.

Figure 2A:
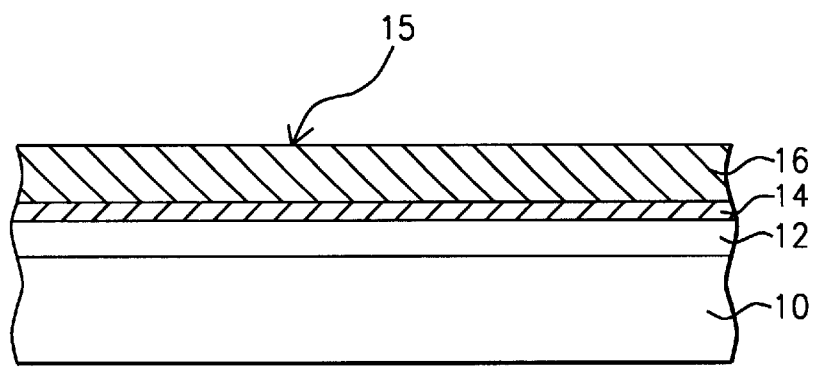
FIG. 2A shows a cross section view of the part of the integrated circuit wafer of FIG. 1 taken along line 2A–2A' of FIG. 1.
Figure 2B:
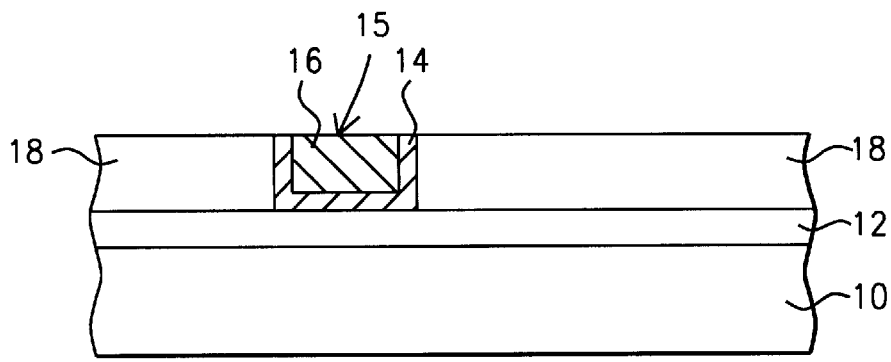
FIG. 2B shows a cross section view of the part of the integrated circuit wafer of FIG. 1 taken along line 2B–2B' of FIG. 1.

FIG. 2A is a cross section view of the part of the integrated circuit wafer shown in FIG. 1 taken parallel to the conductor 16 and is taken along line 2A–2A' of FIG. 1. FIG. 2B is a cross section view of the part of the integrated circuit wafer shown in FIG. 1 taken perpendicular to the conductor 16 and is taken along line 2B–2B' of FIG. 1. FIGS. 2A and 2B show that a layer of first dielectric 12 is formed on a silicon substrate 10 having devices formed therein, not shown. As shown in FIG. 2B a layer of second dielectric 18, such as silicon oxide, is formed on the layer of first dielectric 12 and a trench is etched in the layer of second dielectric 18. As shown in FIGS. 2A and 2B, a layer of barrier metal 14, such as titanium or titanium nitride, is formed on the sidewalls and bottom of the trench and a layer of copper 16 is deposited on the layer of barrier metal 14 to fill the trench. The copper 16 and barrier metal 14 are then removed down to the level of the top of the layer of second dielectric 18, see FIG. 2B.

Figure 3A:
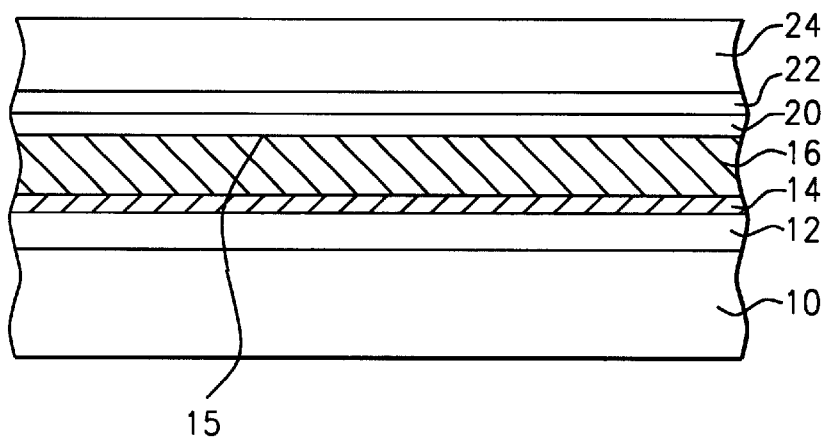
FIG. 3A shows a cross section of the part of the integrated circuit wafer of FIG. 2A after layers of passivation dielectric, etch stop dielectric, and inter-metal dielectric have been deposited.
Figure 3B:
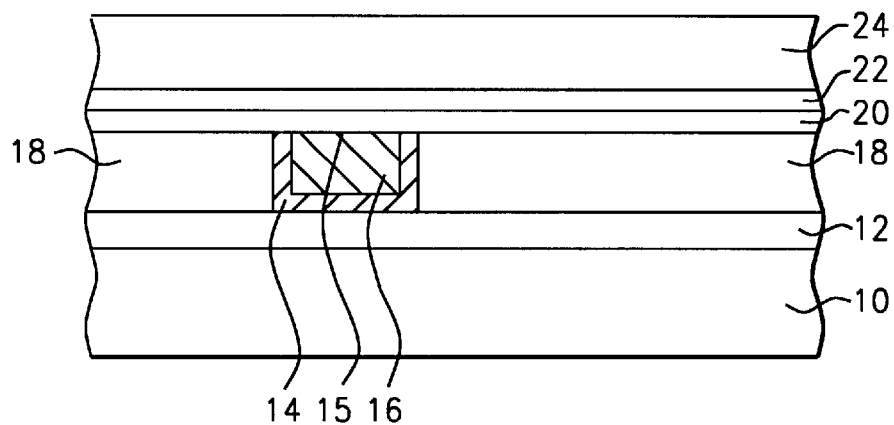
FIG. 3B shows a cross section of the part of the integrated circuit wafer of FIG. 2B after layers of passivation dielectric, etch stop dielectric, and inter-metal dielectric have been deposited.

As shown in FIGS. 2A and 2B, the copper conductor 16 has an exposed copper surface 15. In subsequent process steps a layer of third, or inter-metal, dielectric will be deposited and via holes will be etched in the third dielectric. These process steps will require both passivation of the exposed copper surface 15 and an etch stop layer. The key feature of this invention is the use of a composite dielectric layer to provide the etch stop and passivation. As shown in FIGS. 3A and 3B, a layer of passivation dielectric 20 is deposited on the wafer covering the exposed copper 15. FIG. 3A is a cross section view taken parallel to the copper conductor 16. FIG. 3B is a cross section view taken perpendicular to the copper conductor 16. The passivation dielectric 20 is chosen for good adhesion between the passivation dielectric and the exposed copper as well as for its ability to protect the copper from oxygen or other elements which will degrade the copper surface. In this example the passivation dielectric is silicon nitride, SiN, having a thickness of between about 200 and 500 Angstroms.

A layer of etch stop dielectric 22 is then deposited on the layer of passivation dielectric 20. The etch stop dielectric is chosen for its ability to act as an etch stop for subsequent etching steps and is not required for passivation of the exposed copper. In this example the passivation dielectric is silicon oxynitride, SiON, having a thickness of between about 200 and 500 Angstroms. If silicon nitride alone were used to perform both the functions of etch stop and passivation, a layer of silicon nitride having a thickness greater than the combined thickness of the silicon nitride and silicon oxynitride composite layer would be required. The thinner composite of the passivation dielectric and the etch stop dielectric of this invention provides a lower effective capacitance for the conductors in this structure.

Figure 4A:
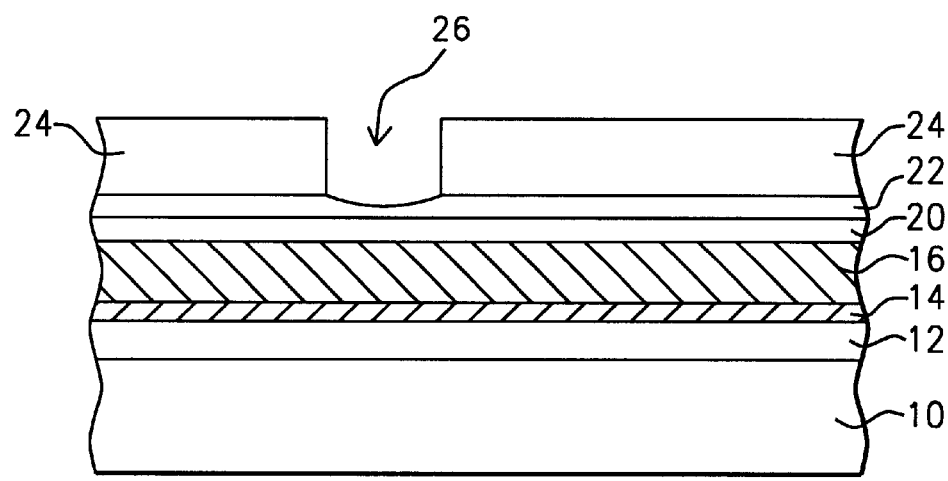
FIG. 4A shows a cross section of the part of the integrated circuit wafer of FIG. 3A after a via hole has been etched in the layer of inter-metal dielectric down to the etch stop dielectric.
Figure 4B:
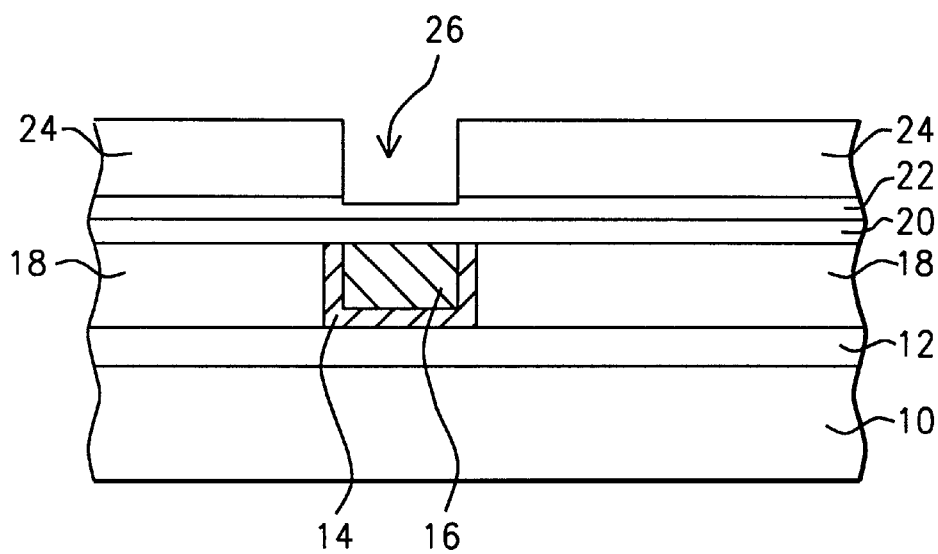
FIG. 4B shows a cross section of the part of the integrated circuit wafer of FIG. 3B after a via hole has been etched in the layer of inter-metal dielectric down to the etch stop dielectric.

A layer of third dielectric 24 is then deposited on the layer of etch stop dielectric 22. The third dielectric 24 may act as a layer of inter-metal dielectric or as a dielectric final passivation for the wafer, but in either case via holes must be formed in the third dielectric. In this example the third dielectric is a layer of silicon oxide having a thickness of between about 5000 and 10,000 Angstroms. Next, as shown in FIGS. 4A and 4B a via hole 26 is etched in the layer of third dielectric 24 using a first etching means and the etch stop dielectric 22 as an etch stop. FIG. 4A is a cross section view taken parallel to the copper conductor 16. FIG. 4B is a cross section view taken perpendicular to the copper conductor 16. The first etching means will readily etch the third dielectric 24 but has a very slow etch rate for the etch stop dielectric 22. As shown in FIGS. 4A and 4B the via hole 26 etch stops at the etch stop dielectric 22. In this example with a third dielectric of silicon oxide, a passivation dielectric of silicon nitride, and an etch stop dielectric of silicon oxynitride the first etching means comprises a dry anisotropic etching main etch and over etch using an etchant of $C_4F_8$ (20 sccm)/$C_2F_6$ (20 sccm)/Ar for the main etch and an etchant of CO (50 sccm)/$C_4F_8$ (3 sccm)/Ar for the over etch.

Figure 5A:
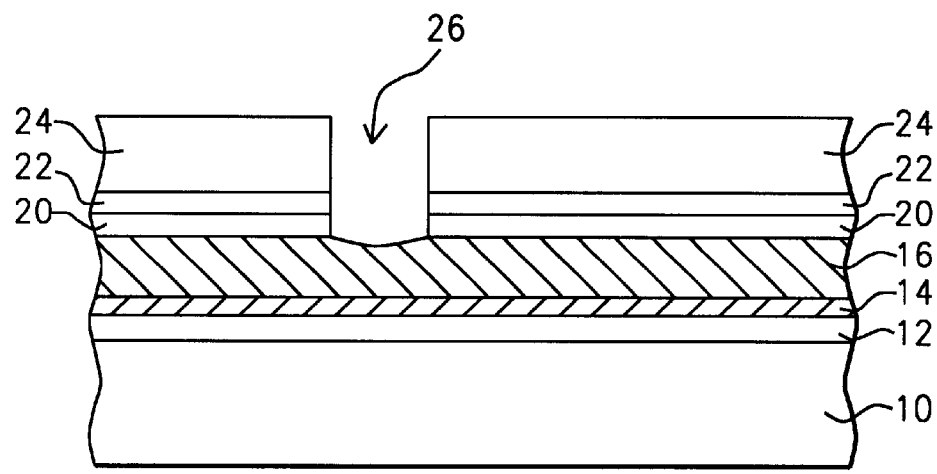
FIG. 5A shows a cross section of the part of the integrated circuit wafer of FIG. 4A after the via hole has been etched through the layers of passivation dielectric and etch stop dielectric.
Figure 5B:
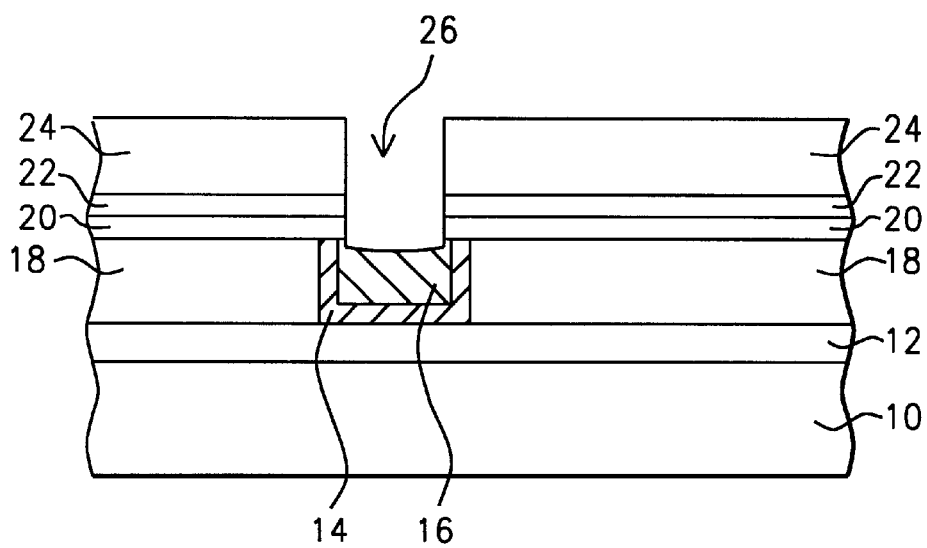
FIG. 5B shows a cross section of the part of the integrated circuit wafer of FIG. 4B after the via hole has been etched through the layers of passivation dielectric and etch stop dielectric.

Next, as shown in FIGS. 5A and 5B, the via hole is etched through the thin composite dielectric of the layer of etch stop dielectric 22 and the layer of passivation dielectric 20 using a second etching means. FIG. 5A is a cross section view taken parallel to the copper conductor 16. FIG. 5B is a cross section view taken perpendicular to the copper conductor 16. The second etching means is a soft or low power dry etch. In this example with a third dielectric of silicon oxide, a passivation dielectric of silicon nitride, and an etch stop dielectric of silicon oxynitride the second etching means is dry anisotropic etching with an etchant of $CH_3F/O_2$ and a power level of 200 watts or less. The second etching means provides a soft etch which completes the opening of the via hole without damage to the other dielectric layers or to the copper conductor.

While the invention has been particularly shown and described with reference to the preferred embodiments thereof, it will be understood by those skilled in the art that various changes in form and details may be made without departing from the spirit and scope of the invention.

What is claimed is:

1. A passivated copper conductor structure, comprising:
    a semiconductor substrate having devices formed therein and a layer of first dielectric formed thereon;
    a layer of second dielectric formed on said layer of first dielectric;
    copper conductors imbedded in said layer of second dielectric, wherein said copper conductors have an exposed top surface;
    a layer of passivation dielectric having a first thickness formed on said layer of second dielectric and said exposed top surface of said copper conductors;

a layer of etch stop dielectric having a second thickness formed on said layer of passivation dielectric;

a layer of third dielectric formed on said layer of etch stop dielectric; and via holes formed in said layer of third dielectric, said layer of etch stop dielectric, and said layer of passivation dielectric exposing part of said copper conductors.

2. The passivated copper conductor structure of claim 1 wherein said passivation dielectric is silicon nitride, SiN.

3. The passivated copper conductor structure of claim 1 wherein said etch stop dielectric is silicon oxynitride, SiON.

4. The passivated copper conductor structure of claim 1 wherein said first thickness is between about 200 and 500 Angstroms.

5. The passivated copper conductor structure of claim 1 wherein said second thickness is between about 200 and 500 Angstroms.

6. The passivated copper conductor structure of claim 1 wherein said third dielectric is silicon oxide.

* * * * *